TUNEABLE DOUBLE-TUNED CIRCUITS WITH VARIABLE COUPLING

Filed Dec. 6, 1962 2 Sheets-Sheet 1

INVENTORS.
ROBERT J. HESSELBERTH
FLOYD A. KOONTZ
BY
T. L. Styner
ATTORNEY

TUNEABLE DOUBLE-TUNED CIRCUITS WITH VARIABLE COUPLING

Filed Dec. 6, 1962 2 Sheets-Sheet 2

United States Patent Office 3,192,491
Patented June 29, 1965

3,192,491

TUNEABLE DOUBLE-TUNED CIRCUITS WITH VARIABLE COUPLING

Robert J. Hesselberth, Rochester, and Floyd A. Koontz, Penfield, N.Y., assignors to General Dynamics Corporation, Rochester, N.Y., a corporation of Delaware Filed Dec. 6, 1962, Ser. No. 242,663
4 Claims. (Cl. 333—17)

This invention relates to high frequency tuning circuits, and particularly to means for tuning coupled resonant circuits over a wide frequency range.

It is relatively easy to tune a single resonant tank circuit over a wide range without materially changing the response characteristic throughout the range except for the expected changes in circuit Q's. However, when conditions require over-all high Q's and sharper discrimination, so-called coupled or double-tuned circuits are indicated. Unfortunately, the shape of the voltage-frequency response curve of the double-tuned circuit changes as the center frequency of the passband is changed. If the circuit is so designed that the shape of the response curve is optimum at one frequency, the curve will have the objectionable two peaks at another frequency. It is desirable, of course, to maintain a substantially constant passband over the entire tuning range. Efforts in this direction include tuning the resonant circuits with variable condensers and using capacitive coupling between the resonant circuits or by using variable inductances and employing inductive coupling between the resonant circuits. In a typical network with capacitive tuning and coupling, it is found that the coefficient of coupling changes, the coefficient being proportional to $1/f^2$, whereas with inductive tuning and coupling the coefficient of coupling is proportional to $f^2$. Most of the distortion of the response curve can be traced to this nonlinear variation in coefficient of coupling.

An object of this invention is to provide an improved double-tuned circuit tuneable over a wide frequency range.

A more specific object of this invention is to provide an improved double-tuned circuit which has a constant optimum response characteristic throughout a wide tuning range.

A still more specific object of this invention is to provide an improved double-tuned circuit having the same response characteristic throughout a wide frequency range and having no moving parts.

The objects of this invention are attained in two resonant circuits which are capacitively coupled. The coupling condenser, according to an important feature of this invention, is varied so as to change the coefficient of coupling throughout the tuning range. In one embodiment, the coefficient of coupling, K, is so changed that $KQ=1$ throughout the tuning range. In the embodiments described below, solid-state diodes are used for the capacitive reactances in the tuning and coupling circuits. The solid-state diodes are of the type which have a distinct capacity-versus-voltage characteristic so that direct current voltages applied across the diodes control the apparent capacities at the terminals of the diodes. Conveniently, the control voltages applied to the tuning diode-condensers and to the coupling diode-condenser are obtained from a single source. Preferably, the single source contains a voltage divider, one segment of which consists of a nonlinear resistance. That is, the mentioned segment comprises a resistor, the resistance of which is a function of current. The voltage for the tuning diode-condensers are obtained across the fixed resistor portions of the divider, while the coupling diode-condenser is obtained across the nonlinear resistance segment of the divider. The rate of change of the tapped voltages are so adjusted that the KQ of the double-tuned circuit equals unity throughout the tuning range.

Other objects and features of this invention will become apparent to those skilled in the art by referring to the specific embodiments described in the following specification and shown in the accompanying drawings, in which.

Figure 1:
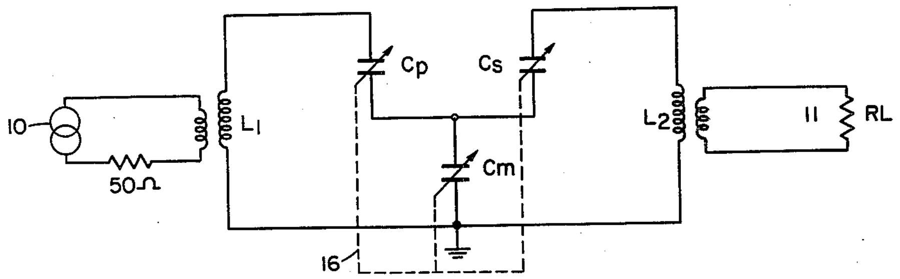
FIG. 1 is a schematic circuit diagram of a double-tuned circuit with a bottom-connected coupling condenser.
Figure 2:
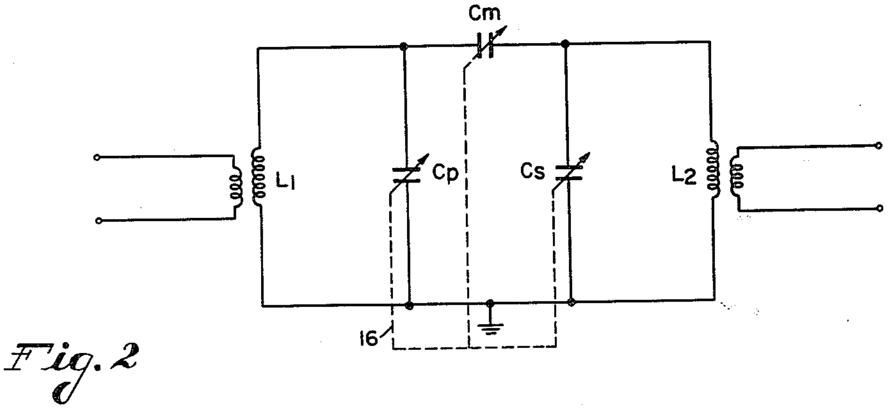
FIG. 2 is a circuit diagram of a double-tuned circuit employing a top-connected coupling condenser.

The two tuned circuits shown in FIG. 1 comprise inductance $L_1$ and condenser $C_p$ and inductance $L_2$ and condenser $C_s$, respectively, in circuits which will be termed the primary and secondary resonant circuits. Energy is coupled between the two resonant circuits by the coupling condenser $C_m$. The double-tuned circuit of FIG. 1 is coupled between the high frequency source 10 and the load 11, each preferably having impedance matched to the impedance of the coupling circuit. The coupling condenser $C_m$ is connected at one end to ground, as shown, and is termed the bottom coupling. In the top coupling embodiment shown in FIG. 2, the coupling condenser $C_m$ is connected serially between the upper or ungrounded ends of the primary and secondary resonant circuits. Generally speaking, the coupling condenser in the top coupled circuit is considerably less in capacity than the capacity of the bottom-connected coupling condenser for a given frequency. According to this invention, the tuning condensers $C_p$ and $C_s$ and the coupling condenser $C_m$ are interlocked by mechanical or electrical linkage 16.

Figure 3:
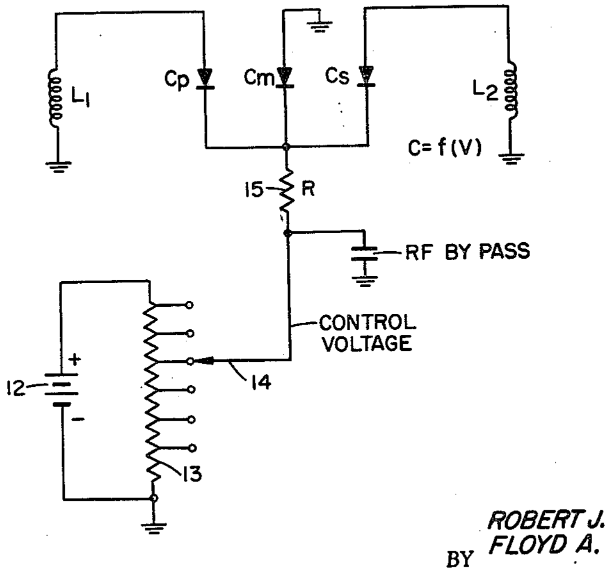
FIG. 3 is a circuit diagram of a double-tuned circuit with diode condensers.
Figure 5:
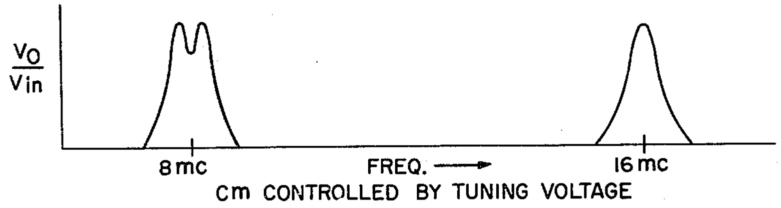
FIG. 5 shows the response characteristic of a double-tuned circuit of the type shown in FIG. 3.

Conveniently, the tuning condensers $C_p$ and $C_s$ of the primary and secondary tuning circuits as well as the coupling condenser $C_m$ comprise the capacities of solid-state diodes. When silicon diodes of the PN junction type are biased in the reverse direction, the total charge in the barrier region is increased. The process of charging up the barrier when the voltage across the diode changes gives rise to an effective variable capacity which is a function of voltage. This barrier capacitance may be of the order of 10 micromicrofarads and is noticeably nonlinear with respect to the applied voltage. In FIG. 3, the voltage for back-biasing $C_p$, $C_s$ and $C_m$ is derived from the voltage source 12 and the voltage divider 13. Movable contact 14 selects the diode voltage, the selected voltage being either variable in discrete steps as by taps to the divider, or variable continuously in conventional potentiometer-fashion. The bias voltage in the example of FIG. 3 is positive and is applied to the cathode terminals of the diode-condensers through the isolating resistor 15. By changing the voltage at 14, the back bias is simultaneously changed on both the tuning and coupling capacitances. Since the Q of the resonant circuits increase with increased resonant frequency while the coupling, K, decreases, the product of Q and K tends to remain constant. Although the rate of change of the two variables is different, the bandpass characteristics change but little over a considerable frequency range. If the tuning range is 8 to 16 mc., for example, the circuit will be relatively under-coupled at 16 mc. and/or over-coupled at 8 mc. Since over-coupling is evidenced by the familiar double-peaked characteristic, as suggested in FIG. 5, the tuning range of the circuits of FIG. 3 is limited by the distortion of the passband characteristic that can be tolerated at either or both ends of the range. If $C_m$ remains fixed, the depth and width of the valley between the two peaks becomes intolerable over more than a relatively narrow tuning range.

Figure 4:
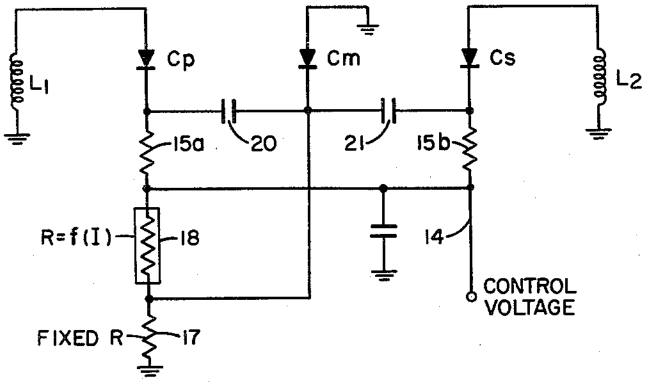
FIG. 4 is a circuit diagram of an alternative double-tuned circuit with diode condensers.
Figure 6:
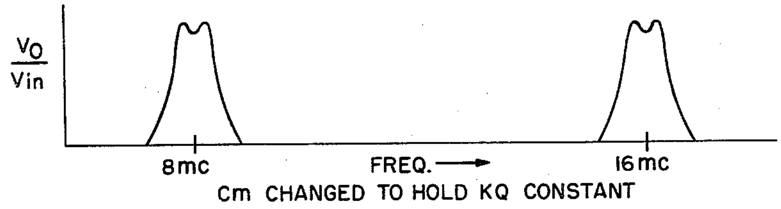
FIG. 6 shows curves of the response characteristics of the double-tuned circuits of the type shown in FIG. 4; and, FIG. 7 is a fragmentary circuit diagram with specific values of one voltage divider employed in the double-tuned circuits of FIG. 4.

According to a further feature of this invention, the voltage to the coupling condenser, $C_m$, is changed at a rate different than the rate of change in the voltage to the tuning condensers, $C_p$ and $C_s$. One example of a circuit for this purpose is shown in FIG. 4. The control voltage at 14 in FIG. 4 is applied across tuning condensers $C_p$ and $C_s$ through isolating resistors 15*a* and 15*b*, so that the primary and secondary resonant circuits are interlocked and are tuned together. The coupling condenser $C_m$, however, is connected to an intermediate point on a voltage divider including fixed resistor 17 and variable resistor 18. Resistor 18 is of the "varistor" type in which resistance is a function of current through the resistor, $R=f(I)$. The values of resistance 17 and varistor 18 are so chosen that the coupling voltage to $C_m$ so changes with respect to the tuning voltage to $C_p$ and $C_s$ as to maintain constant the product of K and Q. That is, $KQ=1$ throughout the tuning range. Throughout the tuning range from, say, 16 mc. to 8 mc., it has been found that the shape and amplitude of the bandpass characteristics remain unchanged, as shown in FIG. 6. Blocking condensers 20 and 21 isolate the direct currents of the two control circuits.

One specific example of computations of the component values of FIG. 4 will be helpful. Assume that the Q of the two tuned circuits are equal and at 16 mc. is 60 and that the frequency range to be tuned is from 8 to 16 mc. For this tuning range, $C_p$ and $S_s$ must each change from 80 to 20 micromicrofarads with fixed inductances $L_p$ and $L_s$. The LC at 8 mc. is 395.78, while the LC at 16 mc. is 98.95 and $L_p$ and $L_s$ are each 4.95 microhenries. Then, the reactance across each tank circuit at 8 mc. is 250 ohms, and at 16 mc. is 500 ohms. It follows that the Q of the tuning circuits is 120 at 8 mc. if the Q is 60 at 16 mc. Now, if $KQ=1$ at both 8 and 16 mc., K8 will be 1/120 and K16 will be 1/60; but, at 8 mc., $C_m$ will equal 9640 micromicrofarads, and at 16 mc., $C_m$ will equal 1200 micromicrofarads. It is seen that $C_m$ must change by a ratio of 8:1 throughout the same range that Q changes by a ratio of 2:1, if KQ is to remain constant.

Figure 7:
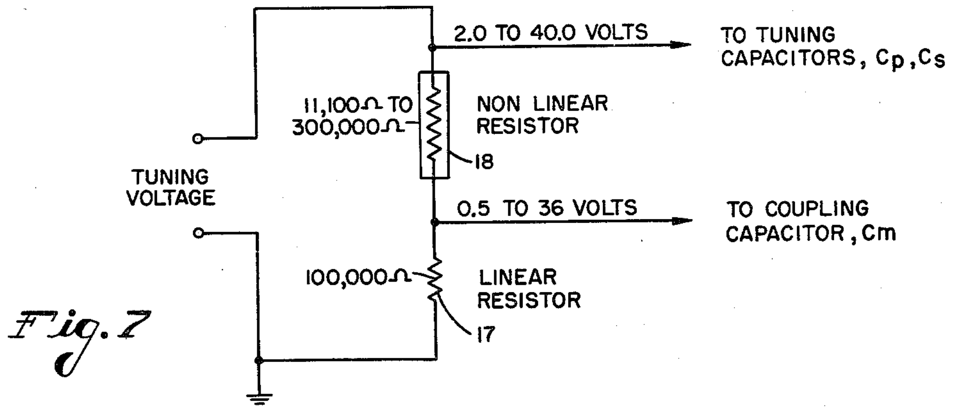

According to this example, the nonlinear resistance 18, FIG. 7, used to derive the control voltage for $C_m$ must perform as follows. Assume that a voltage range of from 2 to 40 volts is available at the control voltage source 14 to tune from 8 to 16 mc. Remembering the 8:1 and 2:1 ratios mentioned, the contorl voltage for $C_m$ must then change from 0.5 to 40 volts to hold KQ constant. When a tuning voltage of 40 was applied to the voltage divider 17–18, there was available 36 volts for $C_m$, in one successfully operated system. If the series resistor 17 is 100,000 ohms, the approximate values of FIG. 7 obtain. When the tuning voltage is reduced to 2.0 volts to tune the circuits to 8 mc., the coupling capacitor voltage must be 0.5 volt. The current through resistor 17 of 100,000 ohms at 0.5 volt is 5 microamperes, and the voltage across variable resistor 18 must be 1.5 volts (2.0–0.5) and the resistance of resistor 18 must be 300,000 ohms. At the other end of the tuning range where 36 volts are available at $C_m$, the current through resistor 17 is 360 microamperes which produces a voltage drop across resistor 18 of 4 volts (40–36). The resistance of resistor 18, then, must be 11,100 ohms. Thus, to tune from 8 to 16 mc. while holding KQ constant, the nonlinear resistance 18 must vary from 300,000 to 11,100 ohms. Since this variable resistance will hold KQ constant, the passband characteristics remain constant throughout a wide tuning range. It will be recognized, of course, that for other tuning ranges and for different components and circuit parameters, the computations above illustrated will vary accordingly.

Many modifications may be made in the details of this invention without departing from the scope of the invention as defined in the appended claims.

What is claimed is:

1. In a double-tuned band-pass filter, a tuneable primary circuit including a first condenser, a tuneable secondary circuit including a second condenser, the Q of said circuits being substantially equal, means for varying the capacity of said first and second condensers as a function of frequency in unison for tuning said circuits, a third condenser connected in common with said primary and secondary circuits for coupling said circuits, and means for varying the capacity of said third condenser as a non-linear function of frequency different from said first-named function whereby to vary coefficient of coupling, K, as said circuits are tuned throughout a predetermined range of frequencies so that the bandpass of said filter remains constant over said range.

2. The filter defined in claim 1 wherein said means for varying the capacity of said third condenser is coupled to said tuning means so that coefficient of coupling, K, varies with respect to variations of resonant frequency and Q as to maintain KQ constant throughout said range.

3. In combination, a first and a second resonant circuit, said resonant circuits each containing tuning condenser means, a coupling condenser means, said coupling condenser means being connected for coupling energy between said resonant circuits, the tuning condenser means and said coupling condenser means being of the type in which capacity is a function of direct current voltage, a direct current voltage source, said source being connected across said condenser means, for applying the voltage of said source thereto and means for changing the voltage which is applied to said coupling condenser means and to said tuning condenser means at rates which are different from each other whereby to retune said resonant circuits and to simultaneously alter the coefficient of coupling between said resonant circuits for minimizing change in band-pass characteristics throughout the tuning range.

4. In combination in a tuneable band-pass filter, a first and a second resonant circuit with similar Q's, a tuning condenser in each resonant circuit, a coupling condenser, said coupling condenser being connected in both resonant circuits to transfer high frequency energy from one resonant circuit to the other, the tuning condensers and the coupling condenser being of the type in which capacity varies with applied direct current voltage, a direct current source, said source being connected across said condensers and being adjustable to simultaneously shift the resonant frequency of said circuit and alter the coefficient of coupling, K, and means for so changing the rate of change of voltage across said coupling condenser with respect to the rate of change of voltage across said tuning condensers that the product KQ remains substantially constant.

(References on following page)

References Cited by the Examiner

UNITED STATES PATENTS

| | | | |
|---|---|---|---|
| 1,869,870 | 8/32 | Stevenson | 325—427 |
| 2,002,193 | 5/35 | Tellegen | 325—490 |
| 2,196,881 | 4/40 | Wheeler | 325—457 |
| 2,290,705 | 7/42 | Pfost et al. | 325—427 |
| 3,010,015 | 11/61 | Pepperberg | 325—383 |
| 3,019,335 | 1/62 | Brilliant | 325—389 |
| 3,072,849 | 1/63 | Firestone | 325—490 |
| 3,102,987 | 9/63 | Yasuda | 334—15 |

HERMAN KARL SAALBACH, *Primary Examiner.*

BENNETT G. MILLER, *Examiner.*